United States Patent
Fan et al.

(10) Patent No.: US 7,271,348 B1
(45) Date of Patent: Sep. 18, 2007

(54) PROVIDING DECOUPLING CAPACITORS IN A CIRCUIT BOARD

(75) Inventors: Jun Fan, San Marcos, CA (US); Arthur R. Alexander, Valley Center, CA (US); Norman W. Smith, San Marcos, CA (US); James L. Knighten, Poway, CA (US)

(73) Assignee: NCR Corp., Dayton, OH (US)

( * ) Notice: Subject to any disclaimer, the term of this patent is extended or adjusted under 35 U.S.C. 154(b) by 0 days.

(21) Appl. No.: 10/670,829

(22) Filed: Sep. 25, 2003

Related U.S. Application Data

(63) Continuation-in-part of application No. 10/287,116, filed on Nov. 4, 2002, now Pat. No. 6,844,505.

(51) Int. Cl.
*H05K 1/16* (2006.01)

(52) U.S. Cl. .................. 174/260; 174/262; 361/763

(58) Field of Classification Search ............... 174/260, 174/262, 261, 255; 361/760, 761, 763, 792, 361/793, 794, 795, 782, 734, 780, 306.1, 361/306.2, 306.3, 328, 329, 330; 257/532, 257/724, 691
See application file for complete search history.

(56) References Cited

U.S. PATENT DOCUMENTS

| | | | |
|---|---|---|---|
| 5,027,253 A | 6/1991 | Lauffer et al. | |
| 5,261,153 A | 11/1993 | Lucas | |
| 5,583,748 A * | 12/1996 | Gochi et al. ................. | 361/784 |
| 5,796,587 A | 8/1998 | Lauffer et al. | |
| 5,953,203 A | 9/1999 | Tormey et al. | |
| 6,021,050 A * | 2/2000 | Ehman et al. ............... | 361/793 |
| 6,068,782 A | 5/2000 | Brandt et al. | |
| 6,256,850 B1 | 7/2001 | Lauffer et al. | |
| 6,304,425 B1 * | 10/2001 | Mamada ................... | 361/321.2 |
| 6,329,590 B1 | 12/2001 | Alexander et al. | |
| 6,337,798 B1 * | 1/2002 | Hailey et al. ............... | 361/763 |
| 6,407,929 B1 | 6/2002 | Hale et al. | |
| 6,611,419 B1 * | 8/2003 | Chakravorty ............. | 361/306.3 |
| 6,618,266 B2 * | 9/2003 | Blakely et al. ............. | 361/763 |
| 6,809,268 B2 * | 10/2004 | Hayashi et al. ............. | 174/260 |
| 6,975,516 B2 * | 12/2005 | Asahi et al. ................. | 361/761 |

OTHER PUBLICATIONS

U.S. Appl. No. 10/630,886, filed Jul. 30, 2003, Alexander et al.
Chip Scale Review, "Embedded Capacitors Improve Overall Device Performance," pp. 1-3, printed from website http://www.chipscalereview.com/isues/0802/patents.html (Aug.-Sep. 2002).
U.S. Appl. No. 10/287,116, filed Nov. 4, 2002.

* cited by examiner

*Primary Examiner*—Ishwar (I. B.) Patel
(74) *Attorney, Agent, or Firm*—Trop, Pruner & Hu; Harden E. Stevers, III

(57) ABSTRACT

A circuit board includes first and second reference plane layers. A first decoupling capacitor is mounted to a surface of the first reference plane layer, and a second decoupling capacitor is mounted to a surface of the second reference plane layer. Vias extend generally along a first direction through the circuit board. The first and second decoupling capacitors are aligned generally along the first direction to increase an amount of space through which the vias are extendable.

15 Claims, 5 Drawing Sheets

US 7,271,348 B1

PROVIDING DECOUPLING CAPACITORS IN A CIRCUIT BOARD

CROSS-REFERENCE TO RELATED APPLICATION

This is a continuation-in-part of U.S. Ser. No. 10/287,116, filed Nov. 4, 2002, now U.S. Pat. No. 6,844,505.

BACKGROUND

A circuit board is the basic building block for interconnecting electronic devices in a system. Electronic devices, usually integrated circuit (IC) devices, are mounted onto the circuit boards using a number of mounting mechanisms, such as by use of connectors or by directly mounting the devices onto a surface of the circuit board. A circuit board also includes the wiring required to interconnect the devices electrically, and the circuit board provides the primary support for the devices.

The density of signal lines in a circuit board is continually increasing due to the increased density of circuits that can be formed on each IC chip and decreasing size of other circuit components. The number of input/output (I/O) pins that exist on each IC chip can be quite large, which means that a large number of signal wires are needed to carry signals from one IC chip to another component in the system. To increase the density of signal wires that can be provided in the circuit board, a circuit board is usually formed of multiple layers. Some layers contain signal wires for transmitting signals, while other layers contain power and ground reference planes, which are connected to ground or to a power supply voltage, e.g., a three-volt voltage, a five-volt voltage, or some other power supply voltage. In other arrangements of circuit boards, power reference planes are not used.

To connect signal wires in different layers of the circuit board, vias are provided. A via is an electrical connection that is run through multiple layers of the circuit board to complete a signal path at different layers, or to provide an electrical connection to ground or power. Typically, the via is run generally perpendicularly to a main surface of the circuit board.

With large numbers of digital IC chips and signal wires in a circuit board, switching noise can be a problem during system operation, especially at high frequencies. To mitigate switching noise, surface mount technology (SMT) decoupling capacitors are commonly used. These capacitors are mounted to either the primary or secondary (top or bottom) surface of the circuit board, and connected to reference planes through vias. At high frequencies, a capacitor provides a low impedance bypass path for switching noise between a power supply voltage plane and a ground plane.

One issue associated with connecting decoupling capacitors to reference planes is the relatively high inductance resulting from the combination of the capacitor's package, the vias, and the interconnecting structure from the decoupling capacitor to the vias. As frequencies increase into the hundreds of megahertz (MHz) or gigahertz (GHz) range, the impedance associated with the combined inductance of each decoupling capacitor circuit becomes much larger than the capacitive impedance associated with the decoupling capacitor itself. To reduce the package inductance, SMT capacitors are used. To reduce the interconnection inductance, low-inductance interconnections are used, such as short wires, short via holes, wide interconnects, multiple vias, and so forth. Nevertheless, because of the increased impedance caused by the inductance of the via between the decoupling capacitor and the reference plane, the capacitor may not be able to effectively provide a low-impedance bypass path for switching noise at high frequencies. In other words, because of a significant impedance introduced by the via inductance into the decoupling path, a capacitor loses its decoupling effectiveness in providing a bypass path for high frequency noise.

Another issue associated with circuit boards is radiated electromagnetic interference (EMI), which increases as signal density and digital switching speeds increase. EMI is a byproduct of noise currents generated by the switching of active devices in the circuit board. When noise currents reach the DC power bus (which includes power and ground reference planes) of the circuit board, noise voltages can be generated in the power bus that are proportional to the impedance of the power bus. The noise voltages can propagate throughout the power bus and radiate by various mechanisms. Although decoupling capacitors can be used to reduce EMI effects, the effectiveness of conventional decoupling capacitors in this regard is also reduced by the same issues discussed above.

SUMMARY

In general, methods and apparatus are provided to improve the performance of decoupling capacitors in a circuit board. For example, a circuit board includes first and second reference plane layers, a first decoupling capacitor mounted to a surface of the first reference plane layer, and a second decoupling capacitor mounted to a surface of the second reference plane layer. Vias extend generally along a direction through the first and second reference plane layers. The first and second decoupling capacitors are aligned generally along the direction to increase an amount of space in the circuit board through which the vias are extendable.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

Figure 1:
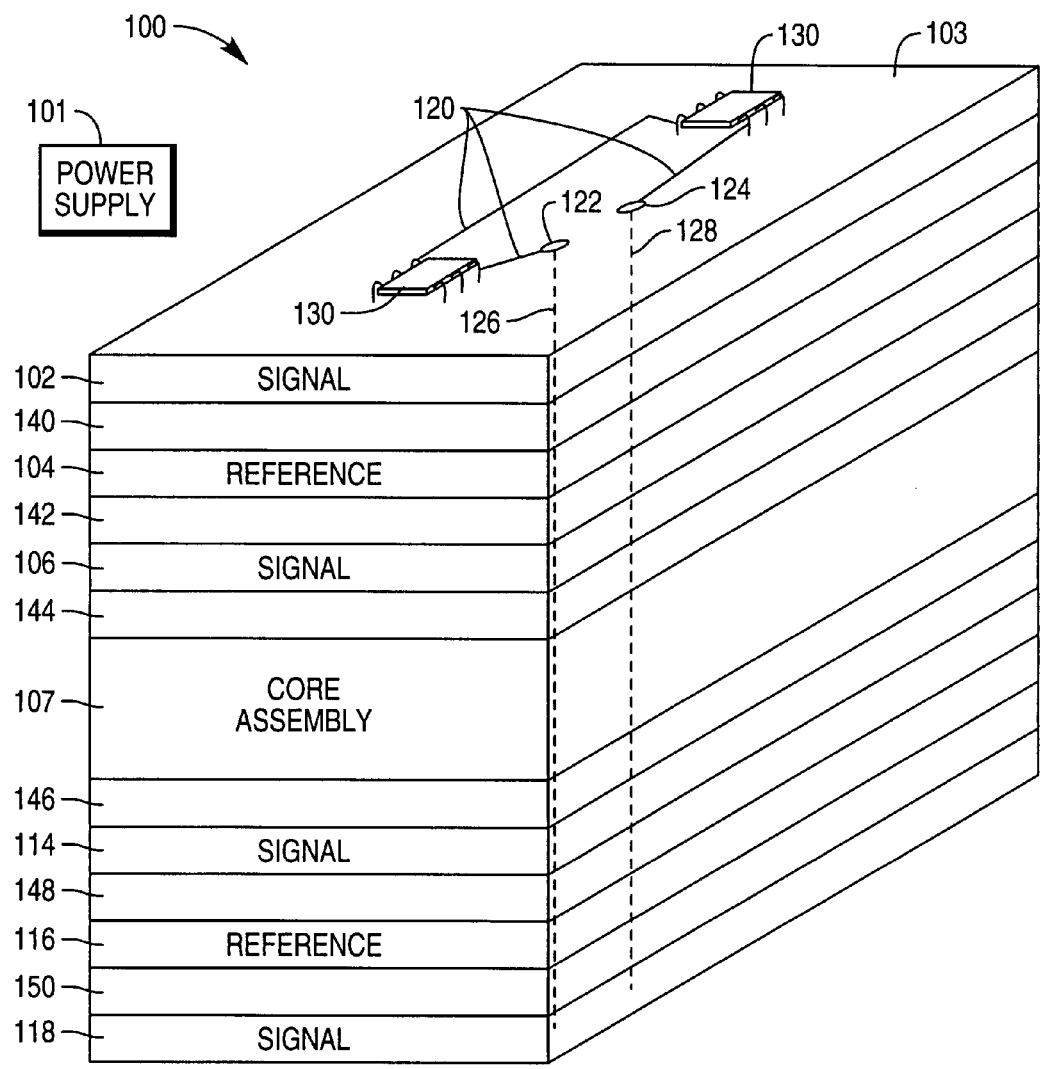
FIG. 1 illustrates an example arrangement of a circuit board that includes buried, discrete decoupling capacitors.

As shown in FIG. 1, an example circuit board 100 includes multiple layers 102, 104, 106, 114, 116, and 118, as well as a core assembly 107 that includes additional layers and components described further below. In other embodiments, a larger or smaller number of layers can be used in the circuit board 100. As used here, a "circuit board" refers to any structure containing signal wires or conductors (for routing signals) and containing power reference planes (to carry ground and power supply voltages). Examples of a "circuit board" include printed wiring boards (PWBs), also referred to as printed circuit boards (PCBs). A "circuit board" also covers any package, such as an integrated circuit (IC) package, that has multiple layers of signal wires or conductors and power and ground reference planes. The circuit board 100 is part of a system that includes various components, such as a hard disk drive, a display, a central processing unit (CPU), a power supply 101 to power the various components, and so forth. Certain components (e.g., active devices 130 or passive devices) are mounted on one surface (or both a top and bottom surface) of the circuit board 100. Moreover, other active devices or passive devices may be embedded within the circuit board.

In the example shown in FIG. 1, the layers 102, 106, 114, and 118 are signal layers for carrying signal wires, while the layers 104 and 116 are reference plane layers that contain either a ground plane or a power supply voltage plane connected to a power supply voltage, (e.g., 3 volts, 5 volts, 12 volts, etc.) produced by the power supply 101. Dielectric layers 140, 142, 144, 146, 148, and 150 are provided between successive signal and/or reference plane layers. The dielectric layers are insulator layers to isolate electrical conductors in the circuit board.

The core assembly 107 contains multiple embedded decoupling capacitors to provide a bypass path for switching noise between a power supply voltage plane and ground plane. The embedded decoupling capacitors also assist in reducing electromagnetic interference (EMI). The decoupling capacitors in the core assembly 107 are embedded in the sense that the decoupling capacitors are buried between other circuit board layers on the two sides of the core assembly 107.

The core assembly 107 also includes a power supply voltage reference layer and a ground reference layer. The decoupling capacitors in the core assembly 107 each has electrodes that are electrically coupled to the power and ground reference layers in the core assembly 107. Additional layers are presented in the core assembly 107 in other embodiments.

Although only one core assembly 107 with embedded decoupling capacitors is present in the circuit board 100 shown in FIG. 1, other circuit boards may utilize additional such core assemblies. For example, one core assembly can be placed close to active devices mounted on a first main surface of a circuit board, while another core assembly is placed close to active devices mounted on another surface of the circuit board.

Further, as shown in FIG. 1, signal traces 120 in the layer 102 route signals from the devices 130 to other points on the circuit board 100. Some of the signal traces 120 connect input/output (I/O) pins of the devices 130 to via pads 122 and 124. The via pads 122 and 124 are in turn connected to vias 126 and 128, respectively, which are passed generally vertically through the multiple layers of the circuit board 100. The vias 126 and 128 are through-hole vias that extend through the layers of the circuit board 100 from one side to another side. Because of a relatively large number of active devices and a relatively large numbers of input/output pins on the active devices, the number of through-hole vias used in the circuit board 100 can be relatively large. In accordance with some embodiments of the invention, embedded decoupling capacitors, such as those in the core assembly 107, are aligned along a direction that is generally perpendicular to a main surface 103 of the circuit board 100. By aligning the embedded capacitors, regions between spaced apart embedded capacitors are defined to provide more space through which the through-hole vias can extend. Aligning capacitors along a given direction refers to lining up the capacitors along the given direction such that the capacitors substantially overlap when viewed along the given direction. This allows multiple lines of capacitors to be formed, with one line of capacitors spaced apart from another line of capacitors. The regions between the spaced apart lines of capacitors can be used for through-hole vias.

Although through-hole vias are used to connect signal wires, such vias (which are associated with relatively high inductances) are not used to connect electrodes of embedded decoupling capacitors in the core assembly 107 with reference plane layers. Instead, embedded discrete capacitors in the core assembly 107 are electrically contacted to reference planes with electrical structures that are associated with much lower inductances than the inductances of through-hole vias used to connect the signal wires. In some embodiments, the electrical contact between electrodes of the decoupling capacitors and the respective reference plane layers is implemented with vias of relatively short length, such as micro-vias or other short-length vias that extend through a relatively small number of circuit board layers. The low inductance of the electrical contact between the embedded capacitor electrodes and the power reference plane layers allows provision of low impedance bypass paths through the decoupling capacitors for high-frequency noise.

Figure 2:
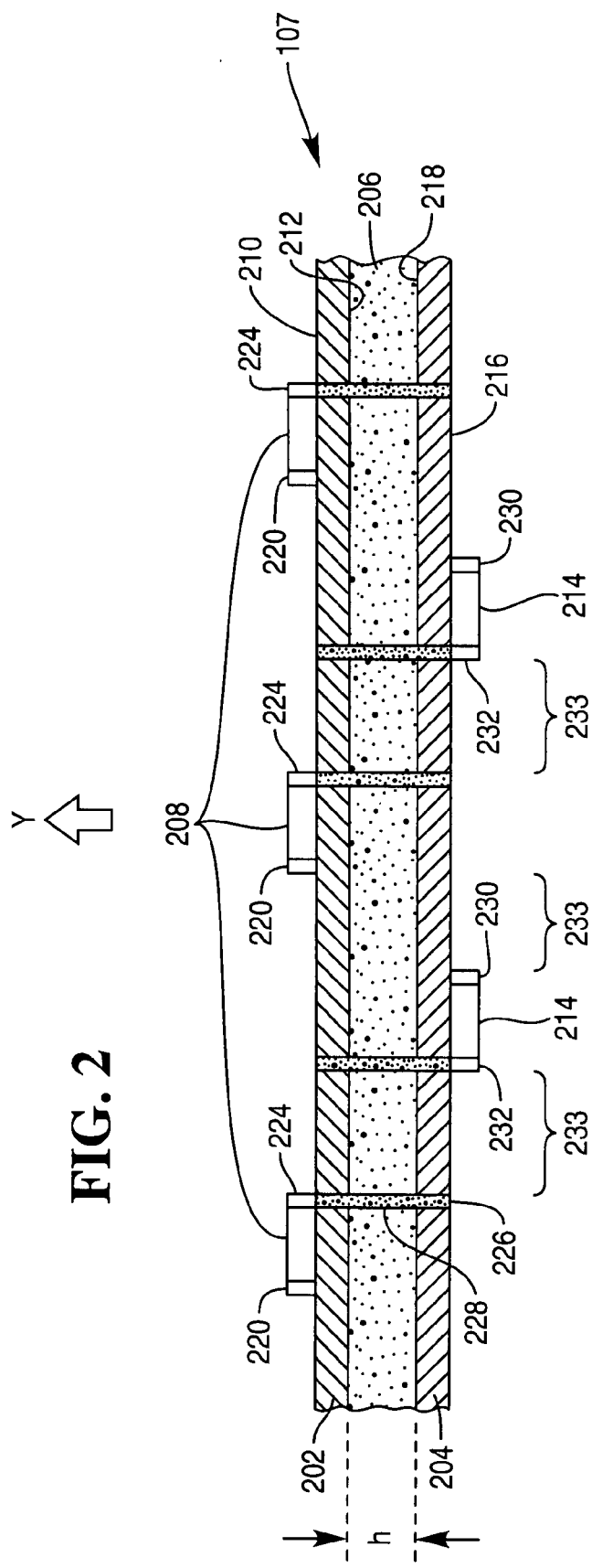
FIG. 2 is a side view of a core assembly in the circuit board of FIG. 1, according to one embodiment.

As shown in FIG. 2, according to one embodiment, the core assembly 107 includes embedded capacitors provided on outer surfaces of the reference plane layers 202 and 204 in the core assembly. The reference plane layers 202 and 204 are separated by a dielectric layer 206.

In addition, the core assembly 107 includes discrete surface mount technology (SMT) capacitors 208 that are placed on the outer surface 210 of the reference plane layer 202 and discrete SMT capacitors 214 that are placed on the outer surface 216 of the reference plane layer 204. Each capacitor 208 has electrodes 220 and 224, with electrode 220 electrically connected to the power reference plane layer 202 (e.g., by soldering, wiring, etc.). The other electrode 224 is electrically connected to a via 226 that extends through a via hole 228 through the layers 202, 206 to contact reference plane layer 204.

Each capacitor 214 has electrodes 230 and 232, with electrode 230 electrically connected to the power reference plane layer 204. The other electrode 232 is electrically connected to a via 226, which extends through layers 204 and 206 to contact reference play layer 202.

As discussed above, one electrode of each of the capacitors shown in FIG. 2 is electrically connected to the surface of the reference plane layer on which the capacitor is mounted. This electrical connection can be achieved with solder or other means. However, the other electrode of the capacitor is insulated from, and thus is not electrically connected to, the surface on which the capacitor is mounted. As shown in the top view of FIG. 3A, the electrode 220 of the capacitor 208 is electrically connected (e.g., soldered) to the top surface 210 of the reference plane layer 202. However, the other electrode 224 of the capacitor 208 is provided in an anti-pad (or clearance) region 240 defined in the reference plane layer 202. As a result, the electrode 224 is electrically isolated from the power reference plane layer 202. A pad 242 is defined to provide a region at which the capacitor electrode is to contact the via. The clearance 240 is defined around the pad 242.

Figure 3A:
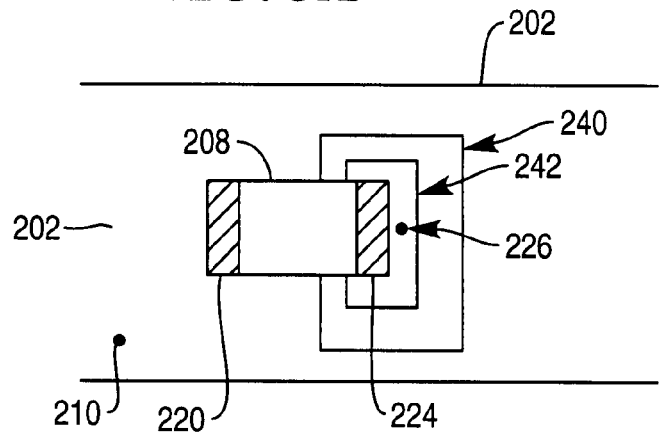
FIG. 3A is a top view of a portion of the core assembly of FIG. 2.
Figure 3B:
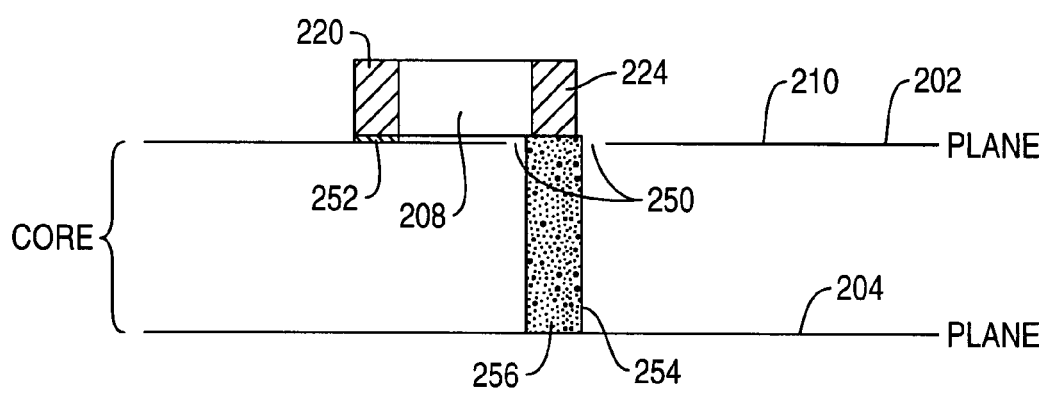
FIG. 3B is a side view of another embodiment.

In a different arrangement, as shown in FIG. 3B, a pad does not need to be defined. A clearance (anti-pad) 250 is defined in the reference plane layer 202. A hole or void 254 is punched, or drilled, or otherwise formed through the reference plane layer 202 and the dielectric layer 206. The capacitor 208 is placed such that its electrode 224 is provided over the hole or void 254. The other electrode 220 of the capacitor 208 is soldered at 252 to the upper surface 210 of the reference plane layer 202.

The circuit is completed when an electrically conductive material, such as electrically conductive epoxy or some other material, is provided to fill the hole or void 254 so that a electrical connection is provided between the capacitor electrode 224 and the power reference plane layer 204. The electrically conductive material forms a via 256.

In one implementation, the hole or void 254 is formed to have a relatively large cross-sectional area (larger than the cross-sectional area of other plated hole vias in the circuit board). As a result, the via 256 has a lower inductance than such other vias. If a punching technique is used to form the hole 254, such a punching technique allows the formation of a hole that is not limited to a circular cross-sectional profile (as would be the case with drilling). Also, punching avoids the need for secondary fabrication steps such as de-burring and plating.

If electrically conductive epoxy or other like material is used to form the via 256, such material is associated with a higher resistance than that offered by a plated via. The increased resistance aids in high-frequency noise mitigation. The overall conductivity (and hence the resistivity) of the epoxy can be tailored by adjusting the percentage of electrically conductive particles mixed into the epoxy.

In the core assembly 107 of FIGS. 2 and 3, buried or embedded vias that extend through a conductive layer and a dielectric layer are employed to electrically connect discrete capacitors 208 and 214 between two reference plane layers. Unlike through-hole vias, the buried or embedded vias extend through a relatively small number of layers and thus are of relatively short length. Therefore, the buried or embedded vias are associated with relatively small inductances so that the capacitors 208 and 214 are able to provide effective bypass paths for high-frequency switching noise.

One issue associated with the arrangement of the core assembly 107 shown in FIG. 2 is that the capacitors 208 and 214 are not aligned in a direction indicated as Y, which is generally perpendicular to the main surfaces 210 and 216 of the core assembly 107. A "main" surface is a surface of a component that has a larger area than another surface of the component. Because the capacitors 208 and 214 are not aligned, the amount of space for through-hole vias (or other types of vias) is decreased. Note that through-hole vias of a circuit board extend through the multiple layers of the circuit board from one main surface to another main surface of the circuit board. Thus, in the arrangement of FIG. 2, the through-hole vias can extend through the core assembly 107 only through the regions 233 between each pair of decoupling capacitors 208 and 214. The space provided by the regions 233 can be rather limited, and thus, may reduce the number of through-hole vias that can be provided in the circuit board 100 of FIG. 2. This may cause a reduction in the signal density or component density that can be provided in the circuit board 100.

Figure 4:
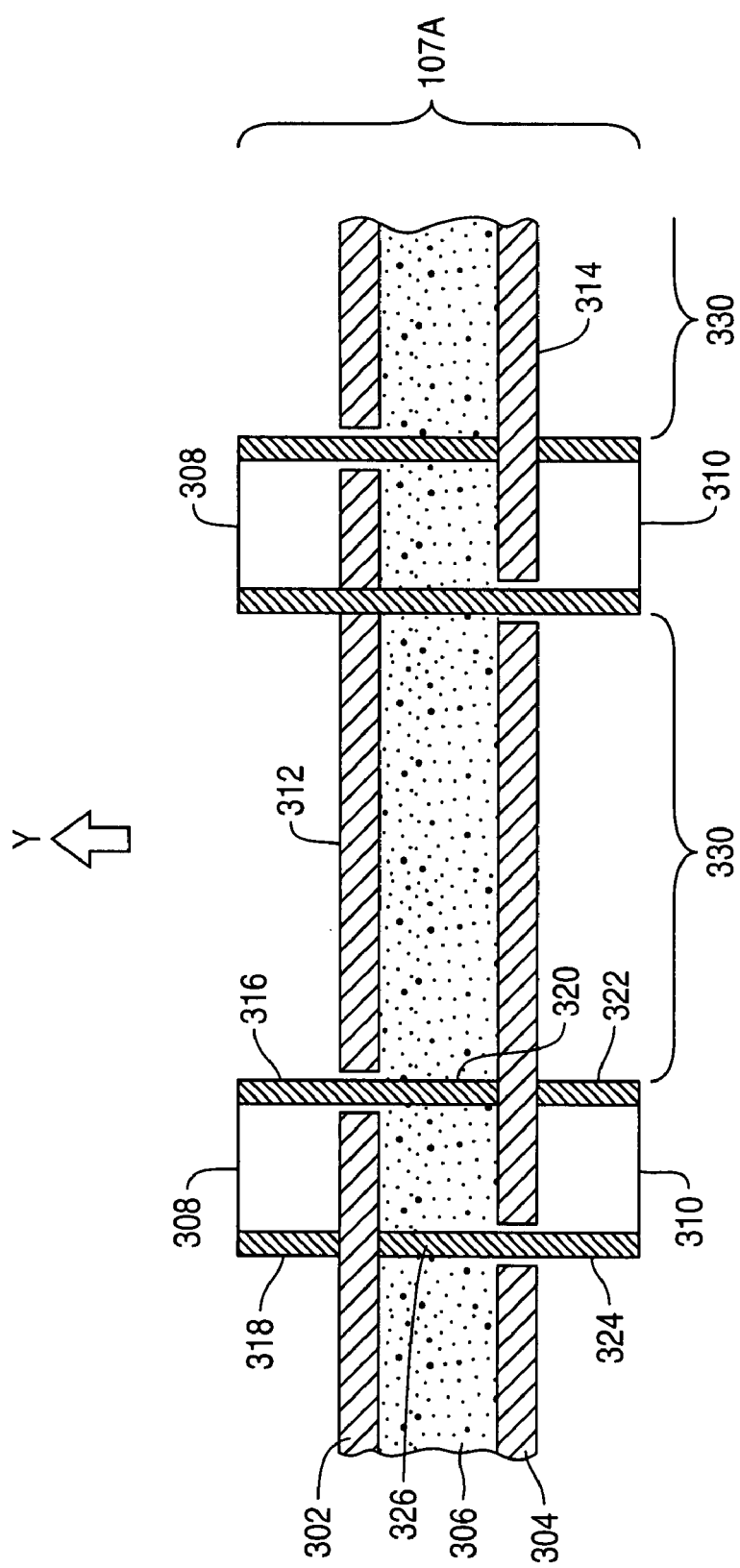
FIG. 4 is a side view of a core assembly in the circuit board of FIG. 1, according to another embodiment.

To overcome this issue, in accordance with some other embodiments of the invention, a core assembly 107A shown in FIG. 4 is employed. The core assembly 107A includes a first reference plane layer 302, a second reference plane layer 304, and a dielectric layer 306 between the reference plane layers 302 and 304. As with the embodiment of FIG. 2, decoupling capacitors 308 and 310 are mounted to the outer surfaces of the core assembly 107A. Decoupling capacitors 308 are mounted to a main surface 312 of the reference plane layer 302, while the decoupling capacitors 310 are mounted to a main surface 314 of the reference plane layer 304.

In the embodiment shown in FIG. 4, each pair of decoupling capacitors 308 and 310 are aligned generally along the Y direction. Capacitors being aligned along a given direction refers to the capacitors being arranged such that a substantial portion of each capacitor runs along the given direction. Plural decoupling capacitors are said to be aligned along a given direction if there is substantial overlap of the decoupling capacitors when viewed along that given direction.

By aligning each pair of capacitors 308 and 310 generally along the Y direction as shown in FIG. 4, larger regions 330 are defined between successive pairs of the capacitors 308 and 310. The capacitors 308 are spaced apart across the main surface 312 of the reference plane layer 302. The capacitors 310 are spaced apart across the main surface 314 of the reference plane layer 304. The arrangement of FIG. 4 provides greater spacing between capacitors than that provided by the arrangement of FIG. 2. Note that through-hole vias of the circuit board 100 (FIG. 1) extend generally along the Y direction. The through-hole vias extend through the regions 330 between the successive pairs of the capacitors 308 and 310. The arrangement of FIG. 4 accommodates a larger number of through-hole vias than the arrangement of FIG. 2. As a result, the density of signals that can be routed from one signal layer to another signal layer using through-hole vias can be increased.

Although reference is made to through-hole vias in the described embodiments, it is noted that the arrangement shown in FIG. 4 can be extended to provide a greater amount of spacing for other types of vias that extend through the core assembly 107. Such other types of vias do not have to be through-hole vias that extend from one side (one main surface) of the circuit board to another side (another main surface) of the circuit board.

Each decoupling capacitor 308 has two electrodes 316 and 318, with the electrode 318 electrically contacted to the reference plane layer 302, and the electrode 316 electrically connected to a via 320 that extends through the reference plane layer 302 and the dielectric layer 306 to electrically contact the reference plane layer 304. Similarly, the decoupling capacitor 310 has electrodes 322 and 324, with the electrode 322 electrically contacted to the reference plane layer 304, and the electrode 324 electrically connected to a via 326 that extends through the reference plane layer 304 and dielectric layer 306 to electrically contact the reference plane layer 302.

The electrodes 316 and 324 are electrically contacted to the vias 320 and 326, respectively, in a manner similar to that shown in FIGS. 3A and 3B.

Figure 5:
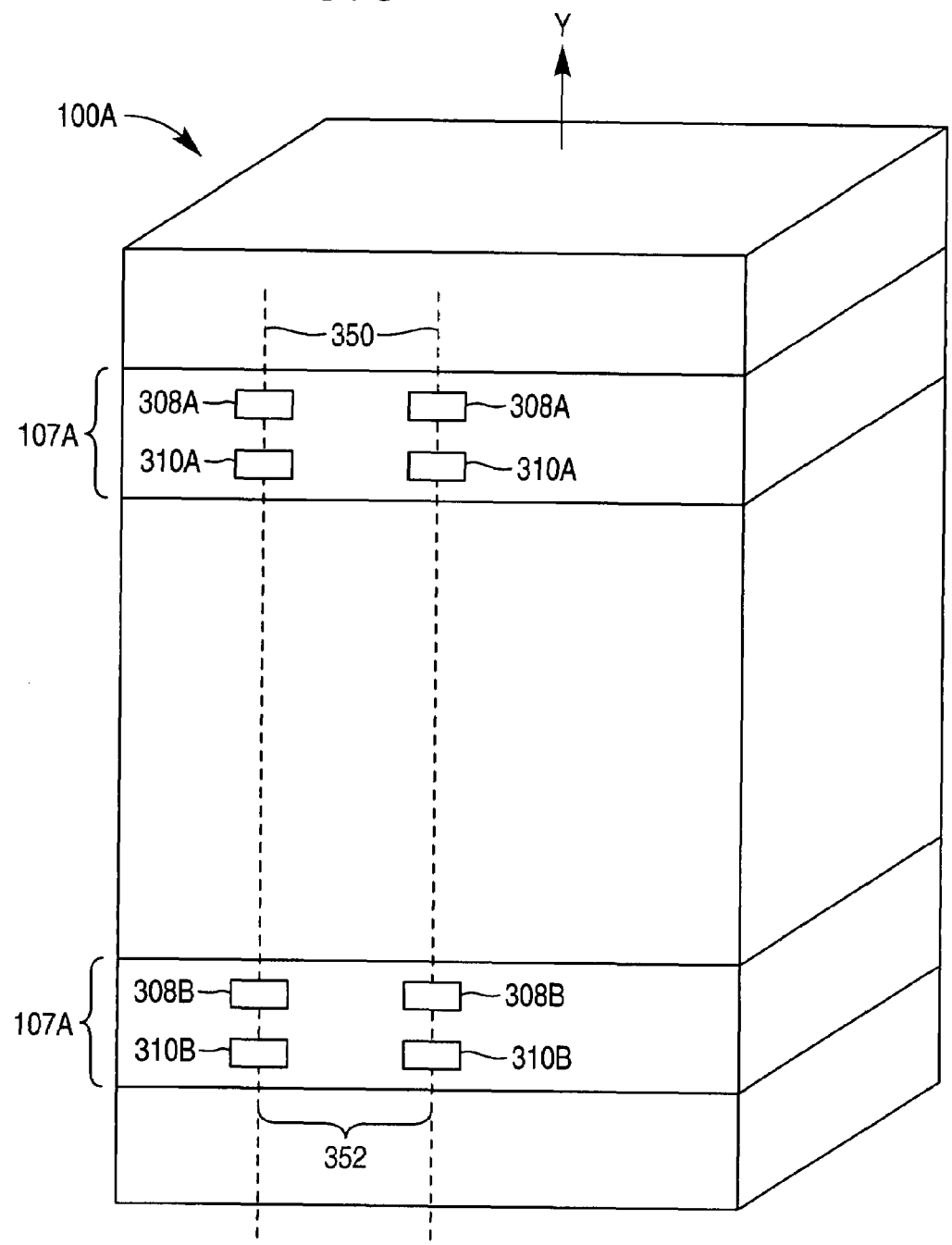
FIG. 5 illustrates a circuit board according to another embodiment.

In some embodiments, one core assembly 107A is provided in the circuit board 100 (in place of the core assembly 107). In an alternative embodiment, as shown in FIG. 5, multiple core assemblies 107A are provided in a circuit board 100A. The embedded decoupling capacitors in the core assemblies 107A are aligned along the Y direction to provide increased spacing between the capacitors for through-hole vias. In this case, each of multiple groups of four capacitors (a pair of capacitors 308A, 310A in one core assembly 107A, and another pair of capacitors 308B, 310B in the other core assembly 107A) are aligned (as indicated by dashed lines 350). Regions 352 are provided between successive groups of the spaced apart capacitors 308A, 310A, 308B, 310B. Through-hole vias are extended through the regions 352.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A circuit board comprising:
   first and second reference plane layers where the inner surface of each layer is separated by and in contact with a dielectric layer;
   an embedded discrete surface mount first decoupling capacitor mounted to the outer surface of the first reference plane layer, the first decoupling capacitor comprising a first electrode connected to the first reference plane and a second electrode;
   a first buried via electrically contacted to the second electrode of the first decoupling capacitors, the first buried via extending through the first reference plane layer and the dielectric layer to electrically contact the second reference plane layer;
   an embedded discrete surface mount second decoupling capacitor mounted to the outer surface of the second reference plane layer, the second decoupling capacitor comprising a first electrode connected to the second reference plane and a second electrode;
   a second buried via electrically contacted to the second electrode of the second decoupling capacitors, the second buried via extending through the second reference plane layer and the dielectric layer to electrically contact the first reference plane layer; and
   vias extending generally along a direction perpendicular to the first and second reference plane layers,
   wherein the first and second decoupling capacitors are aligned generally along the direction and overlapping one another to increase an amount of space in the circuit board through which the vias are extendable.

2. The circuit board of claim 1, wherein the vias comprise through-hole vias that extend from one side of the circuit to another side of the circuit board.

3. The circuit board of claim 1, further comprising additional first decoupling capacitors mounted to the outer surface of the first reference plane layer, and additional second decoupling capacitors mounted to the outer surface of the second reference plane layer,
   wherein each pair of first and second decoupling capacitors are aligned generally along the direction such that multiple spaced-apart lines of decoupling capacitors are provided, each line of decoupling capacitors including a respective pair of first and second decoupling capacitors.

4. The circuit board of claim 3, wherein the vias extend through the circuit board in regions devoid of decoupling capacitors.

5. The circuit board of claim 4, wherein the first and second decoupling capacitors are separated by at least the first and second reference plane layers and the dielectric layer, and the vias extend through the first and second reference plane layers and the dielectric layer.

6. The circuit board of claim 5, further comprising layers provided above and below a core assembly including the first and second reference plane layers, dielectric layer, and first and second decoupling capacitors.

7. The circuit board of claim 3, wherein the first decoupling capacitors are spaced apart with respect to each other across the outer surface of the first reference plane layer, and the second decoupling capacitors are spaced apart with respect to each other across the outer surface of the second reference plane layer.

8. The circuit board of claim 7, further comprising:
   first regions between the spaced apart first decoupling capacitors; and
   second regions between the spaced apart second decoupling capacitors,
   the first and second regions being generally aligned along the direction,
   the vias extending through the circuit board through the first and second regions.

9. The circuit board of claim 3, further comprising:
   a first core assembly including the first and second reference plane layers, a dielectric layer, and the first and second decoupling capacitors; and
   a second core assembly including:
      a third reference plane layer;
      a fourth reference plane layer;
      a second dielectric layer between the third and fourth reference plane layers;
      third decoupling capacitors mounted to a surface of the third reference plane layers;
      fourth decoupling capacitors mounted to a surface of the fourth reference plane layers;
      wherein each pair of the third and fourth decoupling capacitors are aligned generally along the direction.

10. The circuit board of claim 9, wherein a group of first, second, third, and fourth decoupling capacitors are aligned along the direction.

11. A system comprising:
    a power supply;
    an integrated circuit device to be powered by the power supply; and
    a circuit board on which the integrated circuit device is mounted, the circuit board comprising:
    first and second reference plane layers where the inner surface of each layer is separated by and attached to a dielectric layer;
    embedded discrete surface mount first decoupling capacitors mounted to the outer surface of the first reference plane layer, the first decoupling capacitors being spaced apart across the outer surface of the first reference plane layer and each of the first decoupling capacitors includes a first electrode connected to the first reference plane layer and a second electrode;
    a first buried via electrically contacted to the second electrode of one of the first decoupling capacitors, the first buried via extending through the first reference plane layer and the dielectric layer to electrically contact the second reference plane layer;
    embedded discrete surface mount second decoupling capacitors mounted to the
    outer surface of the second reference plane layer,
    the second decoupling capacitors being spaced apart across the outer surface of the second reference plane layer and each of the second decoupling capacitors includes a first electrode connected to the second reference plane and a second electrode;
    a second buried via electrically contacted to the second electrode of one of the second decoupling capacitors, the second buried via extending through the second reference plane layer and dielectric layer to electrically contact the first reference plane layer;

vias extending generally perpendicular to the first and second reference plane layers; and wherein each pair of the first and second decoupling capacitors are aligned in an overlapping manner generally along a direction that is perpendicular to the first and second reference plane layers to increase an amount of space in the circuit board for the vias.

12. The system of claim 11, wherein the vias comprise through-hole vias that extend from one side of the circuit board to another side of the circuit board.

13. The system of claim 11, wherein the circuit board further comprises the vias, the vias extending through the circuit board in regions between spaced apart first and second decoupling capacitors.

14. The system of claim 13, wherein the circuit board further comprises layers provided above and below a core assembly including the first and second reference plane layers, dielectric layer, and first and second decoupling capacitors.

15. The system of claim 14, wherein the circuit board further comprises:

first regions between the spaced apart first decoupling capacitors; and second regions between the spaced apart second decoupling capacitors, the first and second regions being generally aligned along the direction, the vias extending through the circuit board through the first and second regions.

* * * * *